United States Patent
Tanaka et al.

(10) Patent No.: US 10,442,159 B2
(45) Date of Patent: Oct. 15, 2019

(54) ELECTROMAGNETIC SHIELDING MATERIAL

(71) Applicant: JX NIPPON MINING & METALS CORPORATION, Tokyo (JP)

(72) Inventors: Koichiro Tanaka, Ibaraki (JP); Kenji Sato, Tokyo (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 0 days.

(21) Appl. No.: 15/562,472

(22) PCT Filed: Jun. 18, 2015

(86) PCT No.: PCT/JP2015/067662
§ 371 (c)(1),
(2) Date: Sep. 28, 2017

(87) PCT Pub. No.: WO2016/157554
PCT Pub. Date: Oct. 6, 2016

(65) Prior Publication Data
US 2018/0079177 A1    Mar. 22, 2018

(30) Foreign Application Priority Data

Mar. 30, 2015    (JP) .................. 2015-070091

(51) Int. Cl.
| | | |
|---|---|---|
| *B32B 15/08* | (2006.01) | |
| *C23C 8/10* | (2006.01) | |
| *H05K 9/00* | (2006.01) | |
| *C23C 28/00* | (2006.01) | |

(52) U.S. Cl.
CPC ............... *B32B 15/08* (2013.01); *C23C 8/10* (2013.01); *C23C 28/00* (2013.01); *H05K 9/00* (2013.01); *H05K 9/0073* (2013.01); *B32B 2250/05* (2013.01); *B32B 2250/42* (2013.01); *B32B 2307/206* (2013.01); *B32B 2457/00* (2013.01)

(58) Field of Classification Search
CPC . B32B 15/08; B32B 2250/05; B32B 2250/42; B32B 2307/206; B32B 2457/00; C23C 8/10; H05K 9/00; H05K 9/0073
See application file for complete search history.

(56) References Cited

U.S. PATENT DOCUMENTS

| | | | | |
|---|---|---|---|---|
| 4,412,255 A * | 10/1983 | Kuhlman | ................ | H05K 9/00 348/819 |
| 4,507,359 A * | 3/1985 | Powers, Jr. | ............. | C08K 3/08 106/1.14 |
| 4,758,686 A * | 7/1988 | Takahashi | ................. | E06B 5/18 174/381 |
| 4,795,941 A * | 1/1989 | Noda | ..................... | G12B 17/02 313/112 |
| 4,965,408 A | 10/1990 | Chapman et al. | | |
| 4,978,812 A * | 12/1990 | Akeyoshi | ......... | B32B 17/10036 174/389 |
| 5,147,694 A * | 9/1992 | Clarke | ............. | B32B 17/10055 428/34 |
| 5,244,708 A * | 9/1993 | Tsuchida | ................ | B32B 15/08 428/77 |
| 5,260,128 A * | 11/1993 | Ishii | ....................... | B32B 15/08 428/328 |
| 5,401,901 A * | 3/1995 | Gerry | ....................... | B32B 7/02 174/391 |
| 5,506,047 A * | 4/1996 | Hedrick | ................... | B32B 5/18 428/307.7 |
| 2005/0208798 A1 | 9/2005 | Shimoda | | |
| 2005/0219832 A1* | 10/2005 | Pawlenko | ............ | H05K 5/0013 361/818 |
| 2005/0244609 A1* | 11/2005 | Arakawa | ................. | B32B 15/08 428/137 |
| 2008/0012493 A1 | 1/2008 | Lee et al. | | |
| 2008/0049410 A1 | 2/2008 | Kawaguchi et al. | | |

(Continued)

FOREIGN PATENT DOCUMENTS

| | | |
|---|---|---|
| EP | 2416639 A1 | 2/2012 |
| FR | 2854940 A1 | 11/2004 |

(Continued)

OTHER PUBLICATIONS

JP-2013145778-A Machine Translation.*

(Continued)

*Primary Examiner* — Travis M Figg
(74) *Attorney, Agent, or Firm* — Drinker Biddle & Reath LLP

(57) ABSTRACT

Provided is an electromagnetic shielding material having improved electromagnetic shielding properties, light weight properties and formability. The present invention relates to an electromagnetic shielding material having a structure in which at least three metal foils are laminated via insulating layers, wherein all of combinations of the metal foils and the insulating layers making up the electromagnetic shielding material satisfy the equation: $\sigma_M \times d_M \times d_R \geq 3 \times 10^{-3}$, in which:

the symbol $\sigma_M$ represents conductivity of each metal foil at 20° C. (S/m);

the symbol $d_M$ represents the thickness of each metal foil (m); and the symbol $d_R$ represents the thickness of each insulating layer (m).

10 Claims, No Drawings

(56) References Cited

U.S. PATENT DOCUMENTS

| | | | |
|---|---|---|---|
| 2010/0096181 A1* | 4/2010 | Nakamura | B32B 7/02 174/394 |
| 2010/0206628 A1 | 8/2010 | Matsui et al. | |
| 2010/0214713 A1* | 8/2010 | Song | B32B 3/26 361/220 |
| 2011/0122596 A1* | 5/2011 | Miyazaki | H05K 9/0096 361/818 |
| 2012/0111627 A1* | 5/2012 | Kato | B32B 5/022 174/388 |
| 2013/0206471 A1 | 8/2013 | Kammuri et al. | |
| 2016/0165768 A1 | 6/2016 | Tanaka | |
| 2016/0374238 A1 | 12/2016 | Tanaka | |

FOREIGN PATENT DOCUMENTS

| | | | |
|---|---|---|---|
| JP | S60125125 U | | 8/1985 |
| JP | 07290449 A | | 11/1995 |
| JP | 3017484 B1 | | 3/2000 |
| JP | 2003060387 A | | 2/2003 |
| JP | 2003285002 A | | 10/2003 |
| JP | 2006135020 A | | 5/2006 |
| JP | 2006156946 A | | 6/2006 |
| JP | 2008021979 A | | 1/2008 |
| JP | 2010168605 A | | 8/2010 |
| JP | 2010236041 A | | 10/2010 |
| JP | 4602680 B2 | | 12/2010 |
| JP | 2013145778 A | | 7/2013 |
| JP | 2013145778 A | * | 7/2013 |
| JP | 2013236705 A | | 11/2013 |
| JP | 2015015328 A | | 1/2015 |
| KR | 20090024821 A | | 3/2009 |
| KR | 20090051007 A | | 5/2009 |
| WO | 2011121801 A1 | | 10/2011 |
| WO | 2015001817 A1 | | 1/2015 |

OTHER PUBLICATIONS

English translation of the Office Action "Decision to Decline the Amendment" dated Aug. 8, 2017 in corresponding Japanese Application No. 2015-070091 (translated Nov. 14, 2017).

English translation of the Office Action "Notification of Reasons for Refusal" dated Nov. 7, 2017 in corresponding Japanese Application No. 2015-070091 (translated Nov. 14, 2017).

International Search Report of International Application PCT/JP2015/067662, dated Sep. 11, 2015.

* cited by examiner

ELECTROMAGNETIC SHIELDING MATERIAL

TECHNICAL FIELD

The present invention relates to an electromagnetic shielding material. More particularly, the present invention relates to a covering material or a cladding material for electric and electronic devices.

BACKGROUND ART

Recently, high attention has been widely focused on global environmental issues, and environmentally-friendly motor vehicles equipped with secondary batteries such as electric vehicles and hybrid vehicles have been progressively developed. The motor vehicles often employ a method of converting direct current generated from the mounted secondary battery into alternating current through an inverter, and then supplying required electric power to the alternating current motor to obtain driving force. Electromagnetic waves are generated due to switching operation of the inverter and the like. Since the electromagnetic waves disturb reception of on-board acoustic equipment or wireless equipment or like, countermeasures have been taken to house the inverter or the battery, motor or like together with the inverter in a metallic case to shield the electromagnetic waves (Japanese Patent Application Laid-open Publication No. 2003-285002 A1).

The electromagnetic waves are emitted not only from the motor vehicles but also from many electric and electronic devices including communication devices, displays and medical devices. The electromagnetic waves may cause erroneous operation of precision devices, and an adverse effect on a human body is further concerned. Therefore, various techniques have been developed for reducing the adverse effects of the electromagnetic waves using an electromagnetic shielding material. For example, a copper foil composite obtained by laminating a copper foil and a resin film has been used as the electromagnetic shielding material (Japanese Patent Application Laid-open Publication No. H07-290449 A1). The copper foil has electromagnetic shielding properties, and the resin film is laminated for reinforcement of the copper foil. An electromagnetic shielding structure is also known, in which metal layers are laminated on an inner side and an outer side of an intermediate layer made of an insulating material, respectively (Japanese Patent No. 4602680). An electromagnetic shielding optical member is also known, which comprises a base substrate and a laminated member formed on one surface of the base substrate and composed of a plurality of repetitive unit films comprising a metal layer and a high refractive index layer of niobium pentoxide (Japanese Patent Application Laid-open Publication No. 2008-21979 A1).

CITATION LIST

Patent Literature

Patent Document 1: Japanese Patent Application Laid-Open Publication No. 2003-285002 A1
Patent Document 2: Japanese Patent Application Laid-Open Publication No. H07-290449 A1
Patent Document 3: Japanese Patent No. 4602680
Patent Document 4: Japanese Patent Application Laid-Open Publication No. 2008-21979 A1

SUMMARY OF THE INVENTION

Technical Problem

In the motor vehicles, weight reduction has been a major issue in terms of improvement of fuel economy, and substitution of metal materials with resin materials or carbon fiber materials has also been investigated. However, the electromagnetic shielding effects cannot be expected for the resin materials and carbon fiber materials. On the other hand, if the thickness of the metallic electromagnetic shielding material is excessively decreased, an improved shielding effect (for example, 36 dB or more at 1 MHz to 1000 MHz) cannot be obtained. The conventional techniques described in Japanese Patent Application Laid-Open Publication No. H07-290449 A1 and Japanese Patent No. 4602680 also require a significantly increased thickness of the electromagnetic shielding material for obtaining the improved shielding effect, so that the sufficient weight reduction cannot be achieved and improved formability cannot be obtained. The conventional technique described in Japanese Patent Application Laid-Open Publication No. 2008-21979 A1 laminates the nanometric metal layer in order to ensure optical transmission, so that the electromagnetic shielding properties are limited, and the excessively thin metal layer leads to poor formability.

The present invention has been made in light of the above circumstances. An object of the present invention is to provide an electromagnetic shielding material having improved electromagnetic shielding properties, light weight properties and formability, and more particularly to provide an electromagnetic shielding material suitable as a covering material or a cladding material for electric and electronic devices.

Solution to Problem

The present inventors have made extensive studies to solve the above-mentioned problems, and found that lamination of three or more metal foils with insulating layers interposed therebetween has significantly improved the electromagnetic shielding effect, and that in this case, a particularly improved electromagnetic shielding effect has been produced by appropriately combining conductivity and thickness of the metal foils and thickness of the insulating layers. The present invention has been completed on the basis of the findings and can be specified as follows:

In one aspect, the present invention may provide:

an electromagnetic shielding material having a structure in which at least three metal foils are laminated via insulating layers, wherein all of combinations of the metal foils and the insulating layers making up the electromagnetic shielding material satisfy the equation: $\sigma_M \times d_M \times d_R \geq 3 \times 10^{-3}$, in which:

the symbol $\sigma_M$ represents conductivity of each metal foil at 20° C. (S/m);

the symbol $d_M$ represents the thickness of each metal foil (m); and the symbol $d_R$ represents the thickness of each insulating layer (m).

In one embodiment of the electromagnetic shielding material according to the present invention, the conductivity of each metal foil at 20° C. may be $1.0 \times 10^6$ S/m or more.

In another embodiment of the electromagnetic shielding material according to the present invention, the thickness of each metal foil may be from 4 to 100 μm.

In yet another embodiment of the electromagnetic shielding material according to the present invention, each insulating layer may have relative dielectric constant at 20° C. of from 2.0 to 10.0.

In yet another embodiment of the electromagnetic shielding material according to the present invention, the thickness of each insulating layer may be from 4 to 500 μm.

In yet another embodiment of the electromagnetic shielding material according to the present invention, the total thickness of the metal foils may be from 15 to 150 μm.

In another aspect, the present invention may provide a covering material or a cladding material for electric or electronic devices, comprising the electromagnetic shielding material according to the present invention.

In yet another aspect, the present invention may provide electric or electronic device comprising the covering material or the cladding material according to the present invention.

Advantageous Effects of Invention

The electromagnetic shielding material according to the present invention can provide the improved electromagnetic shielding effect while reducing the total thickness of the metal foils to be used, because the three or more metal foils are laminated via the insulating layers under certain conditions. Therefore, the weight reduction can be achieved, as well as the formability can also be ensured. Further, the electromagnetic shielding material according to the present invention can be constructed with the simple structure of the metal foils and the insulating layers, and have excellent economic efficiency.

DESCRIPTION OF EMBODIMENTS (Metal Foil)

Materials of the metal foils for use in the electromagnetic shielding material according to the present invention are not particularly limited, but metal materials with high conductivity are preferred in terms of improving the shielding properties against an alternating magnetic field and an alternating electric field. Specifically, the metal foils may preferably be formed by a metal having conductivity of $1.0 \times 10^6$ S/m (a value at 20° C.; the same will apply hereinafter) or more. The conductivity may preferably be $10.0 \times 10^6$ S/m or more, and still more preferably $30.0 \times 10^6$ S/m or more, and most preferably $50.0 \times 10^6$ S/m or more. Examples of the metal include iron having conductivity of about $9.9 \times 10^6$ S/m, nickel having conductivity of about $14.5 \times 10^6$ S/m, aluminum having conductivity of about $39.6 \times 10^6$ S/m, copper having conductivity of about $58.0 \times 10^6$ S/m, and silver having conductivity of about $61.4 \times 10^6$ S/m. In view of both electric resistivity and costs, aluminum or copper may preferably be used for practical use. All of the metal foils used in the electromagnetic shielding material according to the present invention may be the same metal, or different metals may be used for each layer. Further, alloys of the metals as stated above may be used. Various surface treated layers may be formed on the surface of the metal foil for the purpose of adhesion promotion, environmental resistance, heat resistance and rust prevention.

The metal foils may be subjected to Au plating, Ag plating, Sn plating, Ni plating, Zn plating, Sn alloy plating (Sn—Ag, Sn—Ni, Sn—Cu, and the like), a chromate treatment or like, for example in order to improve environmental resistance and heat resistance that will required when the metal surface is the outermost layer. These treatments may be combined. The Sn plating or the Sn alloy plating may be preferred in terms of costs.

Further, the metal foils may be subjected to the chromate treatment, a roughening treatment, Ni plating or like in order to improve adhesion between the metal foil and the insulating layer. These treatments may be combined. The roughening treatment may be preferred because the adhesion is easily obtained.

Further, it is possible to provide at least one additional metal layer having high relative magnetic permeability in order to improve the shielding effect against the direct current magnetic field. Examples of the additional metal layer having high relative magnetic permeability may include Fe—Ni alloy plating, Ni plating, and the like.

When using the copper foils, copper having higher purity may be preferred because it will improve the shielding performance. The purity may preferably be 99.5% by mass or more, and more preferably 99.8% by mass or more. Examples of the copper foil that can be used include rolled copper foils, electrolytic copper foils, metallized copper foils and the like. Among them, the rolled copper foils may be preferred because they have good flexibility and formability. When alloy elements are added to the copper foil to form a copper alloy foil, the total content of these elements and inevitable impurities may be less than 0.5% by mass. In particular, the copper foil may preferably contain one or more selected from the group consisting of Sn, Mn, Cr, Zn, Zr, Mg, Ni, Si, and Ag in the total amount of 200 to 2000 ppm by mass, in order to improve elongation as compared with a pure copper foil having the same thickness.

The thickness of the metal foils used for the electromagnetic shielding material according to the present invention may preferably be 4 μm or more per one foil. If the thickness is less than 4 μm, the ductility of the metal foil may be remarkably lowered, leading to insufficient formability of the shielding material. Also, if the thickness of the foils per one foil is less than 4 μm, the lamination of a large number of metal foils will be required for obtaining the improved electromagnetic shielding effect, thereby causing a problem of an increase in manufacturing costs. From this viewpoint, the thickness of the metal foils per one foil may preferably be 10 μm or more, and more preferably 15 μm or more, and still more preferably 20 μm or more, and even more preferably 25 μm or more, and still more preferably 30 μm or more. On the other hand, if the thickness of the foils per one foil exceeds 100 μm, the formability will be deteriorated. Therefore, the thickness of the foils may preferably be 100 μm or less, and more preferably 50 μm or less, and more preferably 45 μm or less, and still more preferably 40 μm or less.

It is necessary that at least three metal foils are present in the electromagnetic shielding material in terms of ensuring the improved electromagnetic shielding properties while reducing the total thickness of the metal foils. One or two metal foil layers will lead to an increase in the total thickness of the metal foils needed for obtaining the magnetic field shielding property of 30 dB or more in a low frequency region of about 1 MHz frequency and also lead to an increase in the thickness of one metal foil, so that the formability will be adversely affected. Further, the lamination of three or more metal foils significantly improves the shielding effect as compared with the lamination of single metal foil layer or two metal foil layers, even if the total thickness of these metal foils is the same. However, although the lamination of more metal foils tends to improve the electromagnetic shielding properties, the increased number of the laminated metal foils increase the number of lamination steps, which will lead to an increase in manufacturing costs and will not provide further improvement of the shielding effect. Therefore, the number of the metal foils in the shielding material may preferably be 5 or less, and more preferably 4 or less.

Therefore, in one embodiment of the electromagnetic shielding material according to the present invention, the total thickness of the metal foils may be from 15 to 150 μm, or 100 μm or less, or 80 μm or less, or 60 μm or less.

(Insulating Layer)

In the electromagnetic shielding material according to the present invention, significant improvement of the electromagnetic shielding effect by laminating a plurality of metal foils can be obtained by interposing the insulating layer between the metal foils. Although even if the metal foils directly overlap with each other, the shielding effect may be improved due to an increase in the total thickness of the metal foils, the significant improvement effect cannot be obtained. The reason would be that the presence of the insulating layer between the metal foils increases the number of reflections of electromagnetic waves to attenuate the electromagnetic waves.

The insulating layer having a large difference in impedance from the metal layer may be preferred in order to obtain the improved electromagnetic shielding effect. To generate the large impedance difference, smaller relative dielectric constant of the insulating layer may be required. More specifically, the relative dielectric constant may preferably be 10 (a value at 20° C.; the same will apply hereinafter) or less, and more preferably 5.0 or less, and still more preferably 3.5 or less. In principle, the relative dielectric constant is never smaller than 1.0. In a generally available material, the relative dielectric constant is at least about 2.0. Even if the relative dielectric constant is lowered to be close to 1.0, the increase in the shielding effect is limited, whereas a special and expensive material must be used. In view of the balance between the cost and the effect, the relative dielectric constant may preferably be 2.0 or more, and more preferably 2.2 or more.

Specific examples of the material making up the insulating layer may include glass, metal oxides, papers, natural resins, synthetic resins and the like. Among them, the synthetic resins may be preferred in terms of processability. The materials may contain fiber reinforcing materials such as carbon fibers, glass fibers and aramid fibers. In terms of availability and processability, the synthetic resins include olefin resins such as polyesters, polyethylene and polypropylene, including PET (polyethylene terephthalate), PEN (polyethylene naphthalate) and PBT (polybutylene terephthalate); polyamides, polyimides, liquid crystal polymers, polyacetals, fluororesins, polyurethanes, acryl resins, epoxy resins, silicone resins, phenol resins, melamine resins, ABS resin, polyvinyl alcohol, urea resins, polyvinyl chloride, polycarbonates, polystyrenes, styrene butadiene rubbers and the like. Among them, PET, PEN, polyamides, and polyimides may be preferred in terms of processability and costs. The synthetic resins may be elastomers such as urethane rubbers, chloroprene rubbers, silicone rubbers, fluororubbers, styrene-based elastomers, olefinic elastomers, vinyl chloride-based elastomers, urethane-based elastomers, amide-based elastomers and the like. Furthermore, the synthetic resin itself may play a role of an adhesive, in which case the metal foils will be laminated via the adhesive. Examples of the adhesive include, but not limited to, acrylic resin-based adhesives, epoxy resin-based adhesives, urethane-based adhesives, polyester-based adhesives, silicone resin-based adhesive, vinyl acetate-based adhesives, styrene butadiene rubber-based adhesives, nitrile rubber-based adhesives, phenol resin-based adhesives, cyanoacrylate-based adhesives, and the like. The urethane-based, polyester-based, and vinyl acetate-based adhesives may be preferred in terms of ease of manufacture and costs.

The resin material can be laminated in the form of film or fiber. Although the resin layer may be formed by applying an uncured resin composition to the metal foil and then curing it, it is preferable to use a resin film that can be attached to the metal foil in terms of easy manufacturing. In particular, a PET film may be suitably used. More particularly, the use of a biaxially stretched film as the PET film can increase the strength of the shielding material.

The thickness of the insulating layers is not particularly limited, but since the thickness of one insulating layer of less than 4 μm tends to decrease a (elongation) breaking strain of the shielding material, the thickness of one insulating layer may preferably be 4 μm or more, and more preferably 7 μm or more, and more preferably 10 μm or more, and still more preferably 20 μm or more, and still more preferably 40 μm or more, and even more preferably 80 μm or more, and still more preferably 100 μm or more. On the other hand, the thickness of one insulating layer more than 600 μm also tends to decrease the (elongation) breaking strain of the shielding material. Therefore, the thickness of one insulating layer may preferably be 600 μm or less, and more preferably 500 μm or less.

(Electromagnetic Shielding Material)

The symbols used herein are defined as follows:

$\sigma_M$: conductivity of the metal foil at 20° C. (S/m);

$d_M$: thickness of the metal foil (m);

$Z_R$: impedance of the insulating layer $(\Omega)=Z_0 \times \sqrt{(1/\varepsilon_R)}$;

$\varepsilon_R$: relative dielectric constant of the insulating layer at 20° C.;

$\gamma_R$: propagation constant $= j \times 2 \pi \sqrt{(\varepsilon_R/\lambda)}$; j is the imaginary unit;

$\lambda$: wavelength (m): 300 m at 1 MHz;

$d_R$: thickness of the insulating layer (m);

$Z_o$: impedance in vacuum $=377\Omega$.

The electromagnetic shielding material according to the present invention can be manufactured by laminating the above-mentioned metal foils and the insulating layers. In this case, it is important to select the metal foils and the insulating layers such that all of combinations of the metal foils and the insulating layers making up the electromagnetic shielding material satisfy the equation: $\sigma_M \times d_M \times d_R \geq 3 \times 10^{-3}$, in terms of significantly improving the electromagnetic shielding effect.

The shielding properties can be represented by the following relationship using the four-terminal matrix:

$$\begin{pmatrix} E_x^t \\ H_x^t \end{pmatrix} = \begin{pmatrix} a & b \\ c & d \end{pmatrix} \begin{pmatrix} E_x^i \\ H_x^i \end{pmatrix} \qquad \text{(Eq. 1)}$$

in which $E_x^i$ and $H_x^i$ represent an electric field and a magnetic field of an incident wave, respectively; and $E_x^t$ and $H_x^t$ represent an electric field and a magnetic field of a transmitted wave.

In this case, the shielding effect (SE) can be expressed by the following equation using the Schelkunov method:

$$SE = 20 \log|(a+b/Z_0+cZ_0+d)/2| \qquad \text{(Eq. 2)}$$

When using the metal foil as the shielding material, a may be equal to 1, b may be equal to 0, c may be equal to $\sigma_M \times d_M$, and d may be equal to 1. Substituting these into the equation 1 yields the following equation:

$$\begin{pmatrix} E_x^t \\ H_x^t \end{pmatrix} = \begin{pmatrix} 1 & 0 \\ \sigma_M d_M & 1 \end{pmatrix} \begin{pmatrix} E_x^i \\ H_x^i \end{pmatrix} \quad \text{(Eq. 3)}$$

When using the insulating layer as the shielding material, a may be equal to 1, b may be equal to $Z_R \times \gamma_R \times d_R$, c may be equal to $\gamma_R \times d_R / Z_R$ and d may be equal to 1. Substituting these into the equation 1 yields the following equation:

$$\begin{pmatrix} E_x^t \\ H_x^t \end{pmatrix} = \begin{pmatrix} 1 & Z_R \gamma_R d_R \\ \gamma_R d_R / Z_R & 1 \end{pmatrix} \begin{pmatrix} E_x^i \\ H_x^i \end{pmatrix} \quad \text{(Eq. 4)}$$

Furthermore, the shielding properties when the shielding materials are laminated can be theoretically obtained from the product of the four-terminal matrices corresponding to respective layers. For example, when the shielding material is formed by a laminated structure of metal (M1)/resin (R1)/metal (M2), the incident and transmitted waves can be expressed by the following equation:

$$\begin{pmatrix} E_x^t \\ H_x^t \end{pmatrix} = \begin{pmatrix} 1 & 0 \\ \sigma_{M1} d_{M1} & 1 \end{pmatrix}$$
$$\begin{pmatrix} 1 & Z_{R1} \gamma_{R1} d_{R1} \\ \gamma_{R1} d_{R1} / Z_{R1} & 1 \end{pmatrix} \begin{pmatrix} 1 & 0 \\ \sigma_{M2} d_{M2} & 1 \end{pmatrix} \begin{pmatrix} E_x^i \\ H_x^i \end{pmatrix} =$$
$$\begin{pmatrix} 1 + Z_{R1} \gamma_{R1} d_{R1} \sigma_{M2} d_{M2} & Z_{R1} \gamma_{R1} d_{R1} \\ \sigma_{M1} d_{M1} + & \\ Z_{R1} \gamma_{R1} d_{R1} \sigma_{M1} d_{M1} \sigma_{M2} d_{M2} + & 1 + Z_{R1} \gamma_{R1} d_{R1} \sigma_{M1} d_{M1} \\ \gamma_{R1} d_{R1} / Z_{R1} + \sigma_{M2} d_{M2} & \end{pmatrix}$$
$$\begin{pmatrix} E_x^i \\ H_x^i \end{pmatrix} \quad \text{(Eq. 5)}$$

Further, when the shielding material is formed by a laminated structure of metal (M1)/resin (R1)/metal (M2)/resin (R2)/metal (M3), the incident and transmitted waves can be expressed by the following equation:

$$\begin{pmatrix} E_x^t \\ H_x^t \end{pmatrix} = \begin{pmatrix} 1 & 0 \\ \sigma_{M1} d_{M1} & 1 \end{pmatrix}$$
$$\begin{pmatrix} 1 & Z_{R1} \gamma_{R1} d_{R1} \\ \gamma_{R1} d_{R1} / Z_{R1} & 1 \end{pmatrix} \begin{pmatrix} 1 & 0 \\ \sigma_{M2} d_{M2} & 1 \end{pmatrix}$$
$$\begin{pmatrix} 1 & Z_{R2} \gamma_{R2} d_{R2} \\ \gamma_{R2} d_{R2} / Z_{R2} & 1 \end{pmatrix} \begin{pmatrix} 1 & 0 \\ \sigma_{M3} d_{M3} & 1 \end{pmatrix} \begin{pmatrix} E_x^i \\ H_x^i \end{pmatrix} \quad \text{(Eq. 6)}$$

When the formula is developed, the following equation is obtained:

$$\begin{pmatrix} E_x^t \\ H_x^t \end{pmatrix} = \begin{pmatrix} A & B \\ C & D \end{pmatrix} \begin{pmatrix} E_x^i \\ H_x^i \end{pmatrix} \quad \text{(Eq. 7)}$$

in which A, B, C and D are as follows:

$A = 1 + Z_{R1} \gamma_{R1} d_{R1} \sigma_{M2} d_{M2} + Z_{R2} \gamma_{R2} d_{R2} \sigma_{M3} d_{M3} + Z_{R1} \gamma_{R1} d_{R1} \sigma_{M3} d_{M3} + Z_{R1} \gamma_{R1} d_{R1} Z_{R2} \gamma_{R2} d_{R2} \sigma_{M2} d_{M2} \sigma_{M3} d_{M3};$ $B = Z_{R2} \gamma_{R2} d_{R2} + Z_{R1} \gamma_{R1} d_{R1} Z_{R2} \gamma_{R2} d_{R2} \sigma_{M2} d_{M2} + Z_{R1} \gamma_{R1} d_{R1};$ $C = \sigma_{M1} d_{M1} + \sigma_{M2} d_{M2} + \sigma_{M3} d_{M3} + \gamma_{R1} d_{R1}/Z_{R1} + \gamma_{R2} d_{R2}/Z_{R2} + Z_{R1} \gamma_{R1} d_{R1} \sigma_{M1} d_{M1} + Z_{R1} \gamma_{R1} d_{R1} \sigma_{M1} d_{M1} \sigma_{M3} d_{M3} + Z_{R1} \gamma_{R1} d_{R1} Z_{R2} \gamma_{R2} d_{R2} \sigma_{M1} d_{M1} \sigma_{M2} d_{M2} \sigma_{M3} d_{M3} + Z_{R2} \gamma_{R2} d_{R2} \sigma_{M2} d_{M2} \sigma_{M3} d_{M3} + Z_{R2} \gamma_{R2} d_{R2} \sigma_{M3} d_{M3} \gamma_{R1} d_{R1}/Z_{R1};$ $D = Z_{R2} \gamma_{R2} d_{R2} \sigma_{M1} d_{M1} + Z_{R2} \gamma_{R2} d_{R2} \sigma_{M1} d_{M1} \sigma_{M2} d_{M2} + Z_{R2} \gamma_{R2} d_{R2} \sigma_{M2} d_{M2} + Z_{R1} \gamma_{R1} d_{R1} \sigma_{M1} d_{M1} + Z_{R2} \gamma_{R2} d_{R2} \gamma_{R1} d_{R1}/Z_{R1}.$ It is theoretically understood from the above examples that the shielding effect of the laminate of the metal foils and the insulating layers can be improved by increasing the "$\sigma_M \times d_M \times Z_R \times \gamma_R \times d_R$" for all combinations of the metal foils and the insulating layers to be used. However, as described, for example in Kenichi Hatakeyama at. al., "初めて学ぶ電磁遮へい講座" (Electromagnetic Shielding Course for Biginner), Kagakujoho Shuppan Co., Ltd. (2013), p. 56, it was conventionally believed that the "$Z_R \times \gamma_R \times d_R$" was extremely small to be approximated to zero in the low frequency region. Therefore, according to this idea, the "$\sigma_M \times d_M \times Z_R \times \gamma_R \times d_R$" was also a parameter that was approximated to be zero. In contrast, the present inventors have found that the $d_R$, $\sigma_M$ and $d_M$ are adjusted by combining suitable metal foils and suitable insulating layers, so that the "$\sigma_M \times d_M \times Z_R \times \gamma_R \times d_R$" becomes a large value in such an extent that it cannot be approximated to zero, which has a significant effect even in the low frequency region.

The present inventors have repeated the experiments of the shielding effect of the laminates of the metal foils and the insulating layers, and found that the "$\sigma_M \times d_M \times d_R$" has a significant effect even in the low frequency region of about 1 MHz, and that the shielding effect can be effectively improved by selecting the metal foils and the insulating layers such that all of the combinations of the metal foils and the insulating layers making up the electromagnetic shielding material satisfy the equation: $\sigma_M \times d_M \times d_R \geq 3 \times 10^{-3}$. All of the combinations of the metal foils and the insulating layers making up the electromagnetic shielding material may preferably satisfy $\sigma_M \times d_M \times d_R \geq 1 \times 10^{-2}$, and more preferably $\sigma_M \times d_M \times d_R \geq 4 \times 10^{-2}$, and more preferably $\sigma_M \times d_M \times d_R \geq 8 \times 10^{-2}$, and even more preferably $\sigma_M \times d_M \times d_R ? 0.1 \times 10^{-1}$.

Although no particular upper limit is set to the $\sigma_M \times d_M \times d_R$, all of the combinations of the metal foils and the insulating layers making up the electromagnetic shielding material may generally satisfy $\sigma_M \times d_M \times d_R \leq 10$, and typically $\sigma_M \times d_M \times d_R \leq 1$, in terms of the thickness or materials to be used.

The laminate may be produced by using an adhesive between the insulating layer and the metal foil, or thermocompression-bonding the insulating layer to the metal foil without using the adhesive. Although the laminate may be formed by simply laminating the metal foils and the insulating layers without using the adhesive, at least end portions (for example, each side when the shielding material is in the form of quadrangle) may preferably be bonded by the adhesive or thermocompression bonding, in view of the integrity of the electromagnetic shielding material. However, from the viewpoint of not applying extra heat to the insulating layers, it may be preferable to use the adhesive. The same adhesives as described above may be used, including, but not limited to, acryl resin-based adhesives, epoxy resin-based adhesives, urethane-based adhesives, polyester-based adhesives, silicone resin-based adhesives, vinyl acetate-based adhesives, styrene butadiene rubber-based adhesives, nitrile rubber-based adhesives, phenol resin-based adhesives, cyanoacrylate-based adhesives and the like. Among them, the urethane-based adhesives, the polyester-based adhesives and the vinyl acetate-based adhesives may be preferred in terms of easy manufacturing and costs.

The thickness of the adhesive layer may preferably be 6 µm or less. If the thickness of the adhesive layer exceeds 6 µm, only the metal foils tend to be broken after being laminated into the metal foil composite. However, when the adhesive layer also serves as the insulating layer, the thickness of the adhesive layer may not be limited thereto, and may be the thickness as described above in the section of the insulating layer.

The electromagnetic shielding material according to the present invention should have a structure in which at least three metal foils are laminated via the insulating layers. Examples of the laminated structure having the requirement are as follows. It should be noted that the layer represented by the parenthesis means that the layer may be optionally added.

(1) (insulating layer)/metal foil/insulating layer/metal foil/insulating layer/metal layer/(insulating layer);

(2) (insulating layer)/metal foil/insulating layer/metal foil/insulating layer/metal foil/insulating layer/metal foil/(insulating layer).

In the items (1) and (2), one "metal foil" can be formed by laminating a plurality of metal foils without interposing the insulating layer, and one "insulating layer" can also be formed by laminating a plurality of insulating layers without interposing the metal foil.

Further, it is also possible to provide at least one layer other than the insulating layers and the metal foils.

In one embodiment of the electromagnetic shielding material according to the present invention, the total thickness of the electromagnetic shielding material may be from 50 to 1500 µm, or 1000 µm or less, or 600 µm or less, or 400 µm or less, or 200 µm or less.

The electromagnetic shielding material according to the present invention can be used for various electromagnetic shielding applications such as covering materials or cladding materials, in particular for electric and electronic devices (for example, inverters, communication devices, resonators, electron tubes, discharge lamps, electric heating devices, electric motors, generators, electronic components, printed circuits, medical devices and the like), covering materials for harnesses and communication cables connected to the electric and electronic devices, electromagnetic shielding sheets, electromagnetic shielding panels, electromagnetic shielding bags, electromagnetic shielding boxes, electromagnetic shielding chambers, and the like.

According to one embodiment of the electromagnetic shielding material according to the present invention, the electromagnetic shielding material may have a magnetic field shielding property (a degree of an attenuated signal on a receiving side) of 36 dB or more at 1 MHz, and preferably a magnetic field shielding property of 40 dB or more, and more preferably a magnetic field shielding property of 50 dB or more, and more preferably a magnetic field shielding property of 60 dB or more, and even more preferably a magnetic field shielding property of 70 dB or more, for example a magnetic field shielding property of 36 to 90 dB. In the present invention, the magnetic field shielding property is measured by a KEC method. The KEC method refers to "an electromagnetic shielding property measurement method" in KEC Electronic Industry Development Center.

EXAMPLE

Examples of the present invention are described below together with comparative examples, which are provided for a better understanding of the present invention and its advantages, and are not intended to limit the invention.

Each metal foil and each insulating film as shown in Table 1 were prepared and electromagnetic shielding materials of Examples and Comparative Examples were produced. Each symbol described in Table 1 has the following meaning:

Cu: rolled copper foil (conductivity at 20° C.: $58.0 \times 10^6$ S/m);

Al: aluminum foil (conductivity at 20° C.: $39.6 \times 10^6$ S/m);

Electrolytic Cu: electrolytic copper foil (conductivity at 20° C.: $56.0 \times 10^6$ S/m);

Ni: nickel foil (conductivity at 20° C.: $14.5 \times 10^6$ S/m);

Fe: soft iron foil (conductivity at 20° C.: $9.9 \times 10^6$ S/m);

sus: stainless steel foil (conductivity at 20° C.: $1.4 \times 10^6$ S/m);

PI: polyimide film (relative dielectric constant at 20° C.: 3.5);

PET: polyethylene terephthalate film (relative dielectric constant at 20° C.: 3.0);

PTFE: polytetrafluoroethylene film (relative dielectric constant at 20° C.: 2.1);

PA: polyamide film (relative dielectric constant at 20° C.: 6.0); and

Void: space separated between metal foils by air (relative dielectric constant at 20° C.: 1.0).

Comparative Examples 1 and 2: Magnetic Field Shield Effect of One Metal Foil

The magnetic field shielding effect of a single layer was examined for the rolled copper foil (thickness: 150 µm) and the aluminum foil (thickness: 300 µm). The prepared metal material was set to a magnetic field shielding effect evaluation apparatus (Model TSES-KEC available from Techno Science Japan Co., Ltd.) and the magnetic field shielding effect was evaluated at a frequency of 1 MHz and at 20° C. according to the KEC method.

Comparative Example 3: Magnetic Field Shielding Effect when Three Metal Foils are Laminated Three rolled copper foils (each thickness of 33 µm) were simply laminated without using an adhesive and set to the magnetic field shielding effect evaluation apparatus (Model TSES-KEC available from Techno Science Japan Co., Ltd), and the magnetic field shielding effect was evaluated by the same method as described in Comparative Example 1.

Comparative Example 4: Magnetic Field Shielding Effect when Two Metal Foils are Laminated Via an Insulating Layer A polyethylene terephthalate (PET) film having a thickness of 250 µm as the insulating layer and rolled copper foils each having a thickness of 7 µm as the metal foil were simply laminated without using an adhesive to prepare an electromagnetic shielding material having a laminated structure as shown in Table 1. The electromagnetic shielding material was set to the magnetic field shielding effect evaluation apparatus (Model TSES-KEC available from Techno Science Japan Co., Ltd.) and the magnetic field shielding effect was evaluated by the same method as described in Comparative Example 1.

Comparative Example 5: Magnetic Field Shielding Effect when Two Metal Foils are Laminated Via an Insulating Layer A polyethylene terephthalate (PET) film having a thickness of 100 μm as the insulating layer and rolled copper foils each having a thickness of 8 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Comparative Example 6: Magnetic Field Shielding Effect when Two Metal Foils are Placed Via an Air Layer or Void Using air as the insulating layer and two aluminum foils having thicknesses of 6 μm and 30 μm, respectively, an electromagnetic shielding material having a laminated structure as described in Table 1 was prepared. In this example, the two aluminum foils were parallelly arranged at a space of 50 μm in air by interposing a copper plate having a large square opening in the center between the two aluminum foils. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Comparative Example 7: Magnetic Field Shielding Effect when Three Metallic Foil are Laminated Via Insulating Layers: $\sigma_M \times d_M \times d_R < 3 \times 10^{-3}$ Polyimide (PI) films each having a thickness of 9 μm as the insulating layer and aluminum foils each having a thickness of 6 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 1

Polyimide (PI) films each having a thickness of 100 μm as the insulating layer and rolled copper foils each having a thickness of 17 μm as the metal foil were simply laminating without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd), and the magnetic field shielding effect was evaluated by the same method as described in Comparative Example 1.

Example 2

Polyethylene terephthalate (PET) films each having a thickness of 100 μm as the insulating layer and aluminum foils each having a thickness of 20 μm as the metal foil were simply laminating without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 3

Polyethylene terephthalate (PET) films each having a thickness of 100 μm as the insulating layer and electrolytic copper foils each having a thickness of 30 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 4

Polyethylene terephthalate (PET) films each having a thickness of 100 μm as the insulating layer and nickel foils each having a thickness of 50 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 5

Polyethylene terephthalate (PET) films each having a thickness of 100 μm as the insulating layer and soft iron foils each having a thickness of 50 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 6

Polytetrafluoroethylene (PTFE) films each having a thickness of 500 μm as the insulating layer and stainless steel foils each having a thickness of 50 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 7

Polyethylene terephthalate (PET) films each having a thickness of 100 μm as the insulating layer and rolled copper foils each having a thickness of 6 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 8

Polyethylene terephthalate (PET) films each having a thickness of 100 μm as the insulating layer and rolled copper foils each having a thickness of 17 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 9

Polyethylene terephthalate (PET) films each having a thickness of 100 μm as the insulating layer and rolled copper foils having a thickness of 33 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 10

Polyethylene terephthalate (PET) films each having a thickness of 9 μm as the insulating layer and rolled copper foils having thicknesses of 7 μm and 33 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 11

Polyethylene terephthalate (PET) films each having a thickness of 500 μm as the insulating layer and rolled copper foils each having a thickness of 17 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 12

Polytetrafluoroethylene (PTFE) films each having a thickness of 100 μm as the insulating layer and rolled copper foils each having a thickness of 17 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 13

Polyamide (PA) films each having a thickness of 100 μm as the insulating layer and rolled copper foils each having a thickness of 17 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 14

Polyethylene terephthalate (PET) films each having a thickness of 100 μm as the insulating layer, and rolled copper foils each having a thickness of 33 μm and a nickel foil having a thickness 30 μm were simply laminated without using an adhesive to prepare an electromagnetic shielding material having a laminated structure as described in Table 1. The electromagnetic shielding, material was set to the magnetic field shielding effect evaluation apparatus (Model TSES-KEC available from Techno Science Japan Co., Ltd.), and the magnetic field shielding effect was evaluated by the same method as described in Comparative Example 1.

Example 15

Polyethylene terephthalate (PET) films each having a thickness of 12 μm as the insulating layer, and rolled copper foils each having a thickness of 12 μm and rolled copper foils each having a thickness of 17 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 16

Polyethylene terephthalate (PET) films each having a thickness of 100 μm as the insulating layer and rolled copper foils each having a thickness of 12 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

Example 17

Polyethylene terephthalate (PET) films each having a thickness of 9 μm as the insulating layer and aluminum foils each having a thickness of 20 μm as the metal foil were simply laminated without using an adhesive to prepare an electromagnetic shielding material having a laminated structure as described in Table 1. The electromagnetic shielding material was set to the magnetic field shielding effect evaluation apparatus (Model TSES-KEC available from Techno Science Japan Co., Ltd.), and the magnetic field shielding effect was evaluated by the same method as described in Comparative Example 1.

In the above evaluation, the conductivity of the metal foil was measured by the double bridge method according to JIS C2525: 1999. The relative dielectric constant was measured by the B method according to JIS C2151: 2006.

The results are shown in Table 1. The "Minimum $\sigma_M d_M d_R$" in Table 1 represents a value for a combination of the metal foils and the insulating layers having the smallest "$\sigma_M \times d_M \times d_R$" among all combinations of the metal foils and insulating layers used, in each experimental example. As can be seen from the results of Comparative Examples 1 and 2, the single metal foil only provides the shielding effect of about 31 to 33 dB, even if the thickness of the metal foil is more than 100 μm. As can be seen from the results of Comparative Example 3, no significant improvement of the shielding effect is not observed if only the metal foils are laminated. As can be seen from the results of Comparative Examples 4 to 6, no significant improvement of the shielding effect is not observed if the two metal foils are laminated via the insulating layer. Also, as can be seen from the results of Comparative Example 7, even if the three metal foils are laminated via the insulating layers, the insufficient $\sigma_M \times d_M \times d_R$ only provides limited improvement of the shielding effect.

However, as can be seen from the results of Examples 1 to 17 in which the three metal foils are laminated via the insulating layers and the $\sigma_M \times d_M \times d_R$ is $3 \times 10^{-3}$ or more for all of the combinations of the metal foils and the insulating layers, the shielding effect is significantly improved. For example, when comparing Example 1 with Comparative Example 1, the latter required the thickness of 150 μm for the single copper foil to obtain the shielding effect of 31.1 dB, whereas the former increased the shielding effect by about 26 dB even if the thickness of the copper foil was about ⅓ of that of Comparative Example 1. Further, when comparing Example 2 with Comparative Example 2, the latter required the thickness of 300 μm for the single aluminum foil to obtain the shielding effect of 33.1 dB, whereas the former increased the shielding effect by about 19 dB even if the thickness of the aluminum foil was ⅕ of that of Comparative Example 2.

Further, it is understood that among Examples, the laminate having the higher minimum $\sigma_M d_M d_R$ value for the combination of the metal foils and the insulating layers can produce the higher shielding effect while reducing the total thickness of the metal foils. For example, it is understood that the total thickness of the copper foils for all Examples 10 to 13 is 51 μm, but the shielding effects are significantly different depending on the values of the minimum $\sigma_M d_M d_R$

TABLE 1

| | Laminated Structure | 1st Metal layer Thickness μm | 1st Insulating Layer Thickness μm | 2nd Metal layer Thickness μm | 2nd Insulating Layer Thickness μm | 3rd Metal layer Thickness μm | 3rd Insulating Layer Thickness μm | 4th Metal layer Thickness μm | Minimum $\sigma_M d_M d_R$ | Shielding Effect at 1 MHz dB |
|---|---|---|---|---|---|---|---|---|---|---|
| Example 1 | Cu/PI/Cu/PI/Cu | 17 | 100 | 17 | 100 | 17 | — | — | 9.9E−02 | 57.6 |
| Example 2 | Al/PET/Al/PET/Al | 20 | 100 | 20 | 100 | 20 | — | — | 7.9E−02 | 52.1 |
| Example 3 | Electrolytic Cu/PET/Electrolytic Cu/PET/Electrolytic Cu | 30 | 100 | 30 | 100 | 30 | — | — | 1.7E−01 | 71.1 |
| Example 4 | Ni/PET/Ni/PET/Ni | 50 | 100 | 50 | 100 | 50 | — | — | 7.3E−02 | 50.0 |
| Example 5 | Fe/PET/Fe/PET/Fe | 50 | 100 | 50 | 100 | 50 | — | — | 5.0E−02 | 41.0 |
| Example 6 | sus/PTFE/sus/PTFE/sus | 50 | 500 | 50 | 500 | 50 | — | — | 3.5E−02 | 30.8 |
| Example 7 | Cu/PET/Cu/PET/Cu | 6 | 100 | 6 | 100 | 6 | — | — | 3.5E−02 | 33.5 |
| Example 8 | Cu/PET/Cu/PET/Cu | 17 | 100 | 17 | 100 | 17 | — | — | 9.9E−02 | 57.6 |
| Example 9 | Cu/PET/Cu/PET/Cu | 33 | 100 | 33 | 100 | 33 | — | — | 1.9E−01 | 74.4 |
| Example 10 | Cu/PET/Cu/PET/Cu | 7 | 9 | 33 | 9 | 33 | — | — | 3.7E−03 | 30.1 |
| Example 11 | Cu/PET/Cu/PET/Cu | 17 | 500 | 17 | 500 | 17 | — | — | 4.9E−01 | 85.1 |
| Example 12 | Cu/PTFE/Cu/PTFE/Cu | 17 | 100 | 17 | 100 | 17 | — | — | 9.9E−02 | 57.6 |
| Example 13 | Cu/PA/Cu/PA/Cu | 17 | 100 | 17 | 100 | 17 | — | — | 9.9E−02 | 57.6 |
| Example 14 | Cu/PET/Ni/PET/Cu | 33 | 100 | 30 | 100 | 33 | — | — | 4.4E−02 | 62.1 |
| Example 15 | Cu/PET/Cu/PET/Cu/PET/Cu | 12 | 12 | 17 | 12 | 17 | 12 | 12 | 8.4E−03 | 32.7 |
| Example 16 | Cu/PET/Cu/PET/Cu/PET/Cu | 12 | 100 | 12 | 100 | 12 | 100 | 12 | 7.0E−02 | 61.6 |
| Example 17 | Al/PET/Al/PET/Al/PET/Al | 20 | 9 | 20 | 9 | 20 | 9 | 20 | 7.1E−03 | 36.8 |
| Comp. 1 | Cu | 150 | — | — | — | — | — | — | — | 31.1 |
| Comp. 2 | Al | 300 | — | — | — | — | — | — | — | 33.1 |
| Comp. 3 | Cu/Cu/Cu | 33 | — | 33 | — | 33 | — | — | — | 27.6 |
| Comp. 4 | Cu/PET/Cu | 7 | 250 | 7 | — | — | — | — | — | 28.2 |
| Comp. 5 | Cu/PET/Cu | 8 | 100 | 8 | — | — | — | — | — | 22.9 |
| Comp. 6 | Al/Void/Al | 6 | 50 | 30 | — | — | — | — | — | 26.6 |
| Comp. 7 | Al/PI/Al/PI/Al | 6 | 9 | 6 | 9 | 6 | — | — | 2.1E−03 | 11.8 |

What is claimed is:

1. An electromagnetic shielding material having a structure in which at least three metal foils are laminated via insulating layers, the electromagnetic shielding material having a thickness of each insulating layer of 80 μm or more and a total thickness of the metal foils of from 15 to 150 μm, the total thickness of the electromagnetic shielding material being from 50 to 1051 μm,
- wherein, in the case that the metal foils are aluminum, the thickness of each aluminum foil is 20 μm or more,
- wherein every combination of the metal foils and the insulating layers making up the electromagnetic shielding material satisfy the equation: $\sigma_M \times d_M \times d_R \geq 3 \times 10^{-3}$, and
- wherein the minimum value among possible combinations of the metal foils and the insulating layers satisfies the equation: minimum $\sigma_M \times d_M \times d_R \leq 4.9 \times 10^{-1}$, in which:
- the symbol $\sigma_M$ represents conductivity of each metal foil at 20° C. (S/m);
- the symbol $d_M$ represents the thickness of each metal foil (m); and
- the symbol $d_R$ represents the thickness of each insulating layer (m).

2. The electromagnetic shielding material according to claim 1, wherein the conductivity of each metal foil at 20° C. is $1.0 \times 10^6$ S/m or more.

3. The electromagnetic shielding material according to claim 1, wherein the thickness of each metal foil is from 4 to 100 μm.

4. The electromagnetic shielding material according to claim 1, wherein each insulating layer has a relative dielectric constant at 20° C. of from 2.0 to 10.0.

5. The electromagnetic shielding material according to claim 1, wherein the thickness of each insulating layer is 100 μm or more.

6. The electromagnetic shielding material according to claim 1, wherein the total thickness of the metal foils is from 15 to 100 μm.

7. A covering material or a cladding material for electric and electronic devices, comprising the electromagnetic shielding material according to claim 1.

8. An electric or electronic device comprising the covering material or the cladding material according to claim 7.

9. The electromagnetic shielding material according to claim 1, wherein the thickness of each insulating layer is 500 μm or less.

10. The electromagnetic shielding material according to claim 1, wherein each metal foil and each insulating layer are laminated without using an adhesive.

* * * * *